(12) United States Patent
Juta et al.

(10) Patent No.: US 11,335,613 B2
(45) Date of Patent: May 17, 2022

(54) INSULATING COMPONENT, SEMICONDUCTOR PACKAGE, AND SEMICONDUCTOR APPARATUS

(71) Applicant: KYOCERA Corporation, Kyoto (JP)

(72) Inventors: Masami Juta, Omi-Hachiman (JP); Daisuke Sakumoto, Omi-Hachiman (JP)

(73) Assignee: KYOCERA CORPORATION, Kyoto (JP)

( * ) Notice: Subject to any disclaimer, the term of this patent is extended or adjusted under 35 U.S.C. 154(b) by 184 days.

(21) Appl. No.: 16/487,546

(22) PCT Filed: Feb. 14, 2018

(86) PCT No.: PCT/JP2018/005080
§ 371 (c)(1),
(2) Date: Aug. 21, 2019

(87) PCT Pub. No.: WO2018/155282
PCT Pub. Date: Aug. 30, 2018

(65) Prior Publication Data
US 2020/0058578 A1 Feb. 20, 2020

(30) Foreign Application Priority Data
Feb. 23, 2017 (JP) ............................. JP2017-031899

(51) Int. Cl.
*H01L 23/047* (2006.01)
*H01L 23/10* (2006.01)
(Continued)

(52) U.S. Cl.
CPC ............ *H01L 23/047* (2013.01); *H01L 23/10* (2013.01); *H01L 23/49805* (2013.01);
(Continued)

(58) Field of Classification Search
CPC . H01L 23/047; H01L 23/10; H01L 23/49805; H01L 23/49811; H01L 23/057;
(Continued)

(56) References Cited

FOREIGN PATENT DOCUMENTS

JP 2006-179839 A 7/2006
JP 2010199277 A * 9/2010
(Continued)

*Primary Examiner* — Yu Chen
(74) *Attorney, Agent, or Firm* — Volpe Koenig

(57) ABSTRACT

An insulating component includes an insulating substrate, a metal layer, a bond, and a lead terminal. The plate-like insulating substrate has a groove continuous from its upper to side surfaces. The metal layer includes a first metal layer on the upper surface of the insulating substrate and a second metal layer on an inner surface of the groove continuous with the first metal layer. The bond is on an upper surface of the metal layer. The lead terminal is on an upper surface of the first metal layer with the bond in between, and overlaps the groove. The bond includes a first bond fixing the lead terminal to the first metal layer and a second bond on an upper surface of the second metal layer continuous with the first bond. The groove includes an inner wall having a ridge. The second bond is between the ridge and the lead terminal.

11 Claims, 11 Drawing Sheets

(51) Int. Cl.
 *H01S 5/02216* (2021.01)
 *H01L 23/498* (2006.01)
 H01S 5/02251 (2021.01)
 H01L 23/66 (2006.01)
 H01L 31/0203 (2014.01)
 H01L 31/02 (2006.01)
(52) U.S. Cl.
 CPC .... *H01L 23/49811* (2013.01); *H01S 5/02216* (2013.01); *H01L 23/66* (2013.01); *H01L 31/0203* (2013.01); *H01L 31/02005* (2013.01); *H01L 2223/6627* (2013.01); *H01L 2924/16195* (2013.01); *H01L 2924/16251* (2013.01); *H01L 2924/1715* (2013.01); *H01S 5/02251* (2021.01)
(58) Field of Classification Search
 CPC ... H01L 2924/1715; H01L 2924/17151; H01L 2924/1711
 See application file for complete search history.

(56) References Cited

FOREIGN PATENT DOCUMENTS

| | | | |
|---|---|---|---|
| JP | 2012222079 A | * | 11/2012 |
| JP | 2015103619 A | * | 6/2015 |

* cited by examiner

INSULATING COMPONENT, SEMICONDUCTOR PACKAGE, AND SEMICONDUCTOR APPARATUS

FIELD

The present invention relates to an insulating component, and a semiconductor package and a semiconductor apparatus each including the insulating component.

BACKGROUND

As wireless communication devices including mobile phones are used widely, these devices have higher frequencies to transmit larger volumes of information at a higher speed. Among such devices, a known insulating component includes an insulating substrate having a metal layer for transmitting high-frequency signals and a lead terminal fixed to the metal layer for transmitting signals to an external device (refer to Japanese Unexamined Patent Application Publication No. 2006-179839).

An insulating component described in Japanese Unexamined Patent Application Publication No. 2006-179839 (Patent Literature 1) includes an insulating substrate having side grooves each containing a bond for fixing a lead. However, with the technique described in Patent Literature 1, the grooves each have a constant width, and may not easily hold a sufficient amount of bond between the metal layer and the lead terminal.

BRIEF SUMMARY

An insulating component according to one or more aspects of the present invention includes an insulating substrate, a metal layer, a bond, and a lead terminal. The insulating substrate is plate-like and has a groove located continuously from an upper surface to a side surface of the insulating substrate. The metal layer includes a first metal layer located on the upper surface of the insulating substrate and a second metal layer located on an inner surface of the groove and continuous with the first metal layer. The bond is located on an upper surface of the metal layer. The lead terminal is located on an upper surface of the first metal layer with the bond in between, and overlaps the groove. The bond includes a first bond fixing the lead terminal to the first metal layer and a second bond located on an upper surface of the second metal layer and continuous with the first bond. The groove includes an inner wall having a ridge. The second bond is located between the ridge and the lead terminal.

A semiconductor package according to another aspect of the present invention includes a base, a frame, and the above insulating component. The base has an upper surface. The upper surface of the base has a mount are on which a semiconductor device is mountable. The frame includes a side wall having a through-hole, and surrounds the mount area on the base. The insulating component is mounted in the through-hole.

A semiconductor apparatus according to another aspect of the present invention includes the above semiconductor package, a semiconductor device, and a lid. The semiconductor device is mounted on the mount area in the semiconductor package. The lid is joined to an upper edge of the frame included in the semiconductor package and covers the semiconductor device.

DETAILED DESCRIPTION

Figure 1:
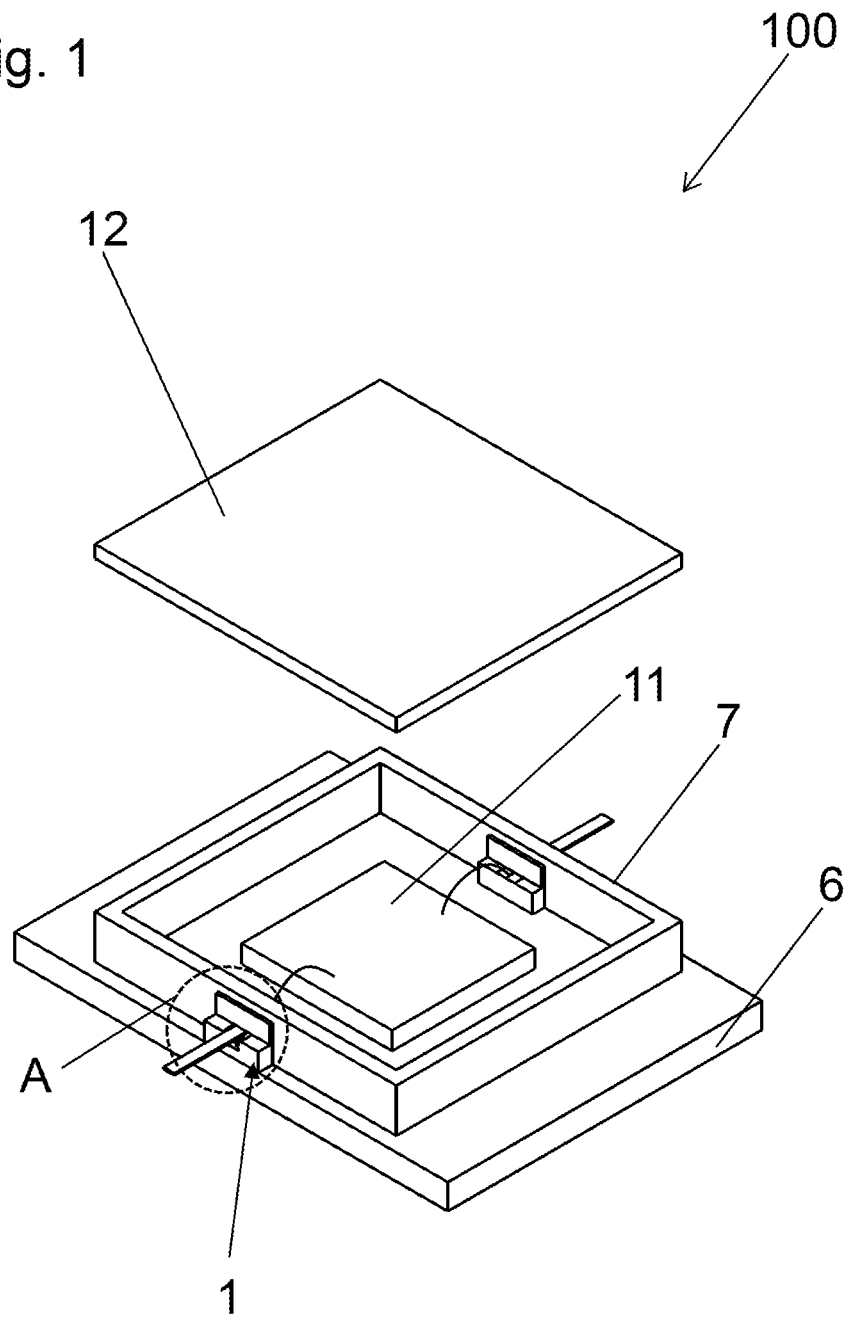
FIG. 1 is a perspective view of a semiconductor apparatus according to an embodiment of the present invention.
Figure 2:
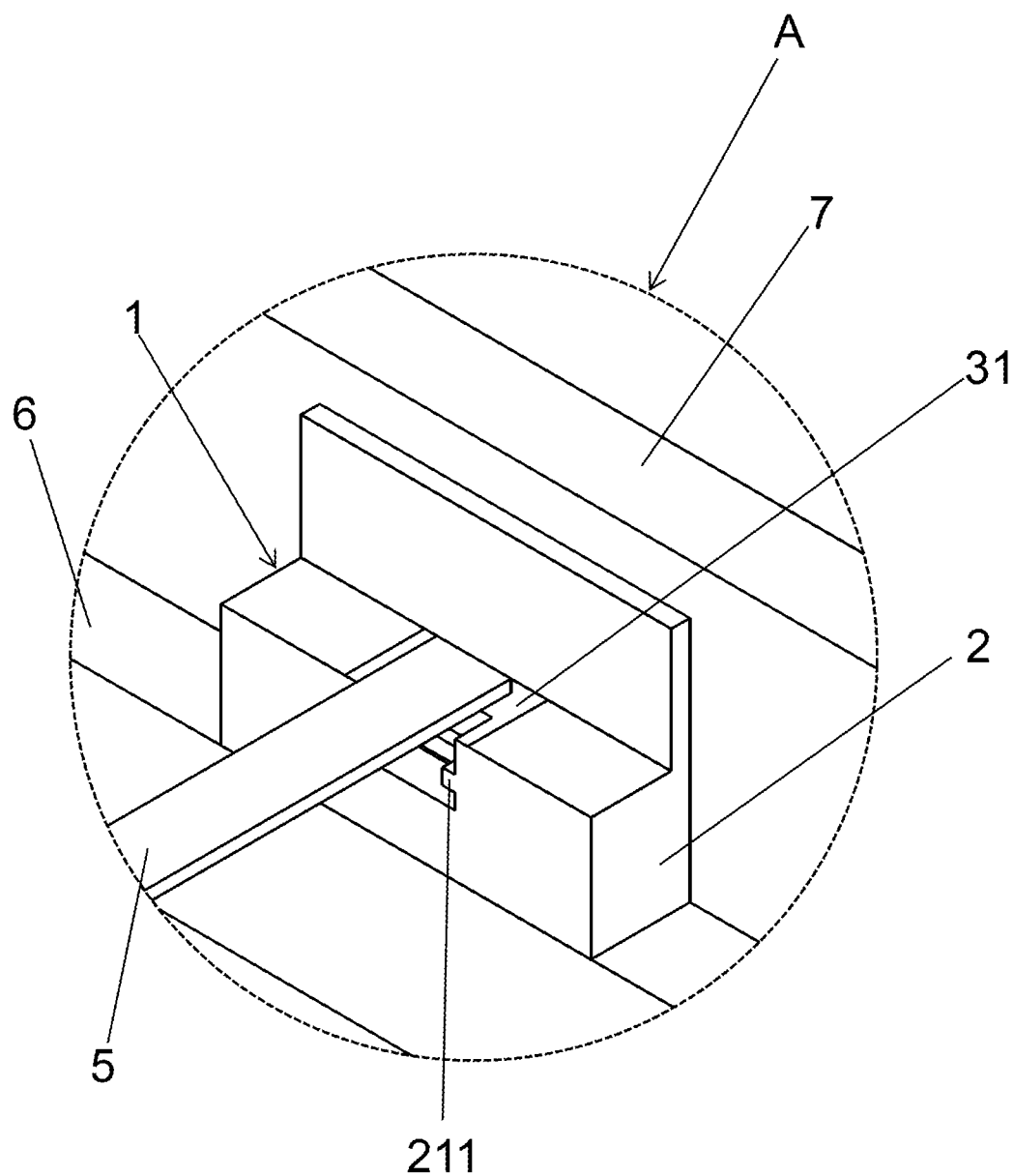
FIG. 2 is an enlarged view of part A of the semiconductor apparatus according to the embodiment of the present invention shown in FIG. 1.

A semiconductor apparatus according to one or more embodiments of the present invention includes a semiconductor package and insulating components described below. The insulating components may be used as, for example, input/output terminals in the semiconductor apparatus or the semiconductor package for electrically connecting a semiconductor device to an external circuit and transmitting, or receiving and outputting electric signals. FIG. 1 is a perspective view of the semiconductor apparatus according to one embodiment of the present invention. In FIG. 1, a lid is removed. FIG. 2 is an enlarged view of part A of the semiconductor apparatus according to the embodiment of the present invention shown in FIG. 1. The semiconductor apparatus, the semiconductor package, and the insulating component according to one or more embodiments of the present invention will now be described with reference to the drawings.

Structure of Semiconductor Apparatus

FIG. 1 is a top perspective view of a semiconductor apparatus 100 according to the embodiment of the present invention. As shown in the figure, the semiconductor apparatus 100 includes a semiconductor package 10, a semiconductor device 11, and a lid 12 according to the embodiment of the present invention.

The semiconductor device 11 may be a laser diode (LD), or may be a photodiode (PD). For an LD, a frame 7 may have a through-hole to receive an optical fiber, in addition to through-holes 71 in which insulating components 1 are to be mounted.

The lid 12 is joined to an upper edge of the frame 7 to cover the semiconductor package 10. The lid 12 is rectangular in a plan view, and has the dimensions of 5×5 mm to 45×45 mm and a height of 0.5 to 3 mm. The lid 12 may be formed from, for example, a metal such as iron, copper, nickel, chromium, cobalt, molybdenum, or tungsten, or an alloy of these metals, such as a copper-tungsten alloy, a copper-molybdenum alloy, or an iron-nickel-cobalt alloy. A metal member for the lid 12 may be prepared by processing (e.g., rolling or punching) an ingot formed from such a metal material.

Structure of Semiconductor Package

Figure 3:
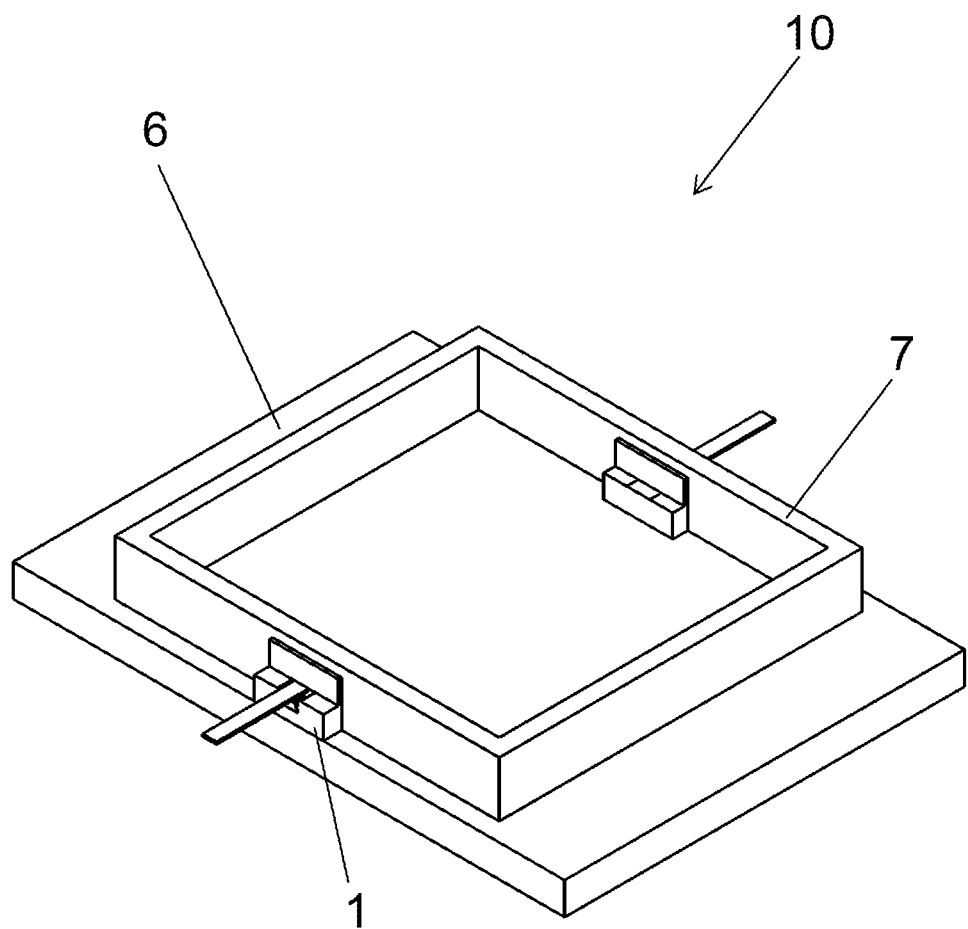
FIG. 3 is a top perspective view of a semiconductor package according to the embodiment of the present invention.
Figure 4:
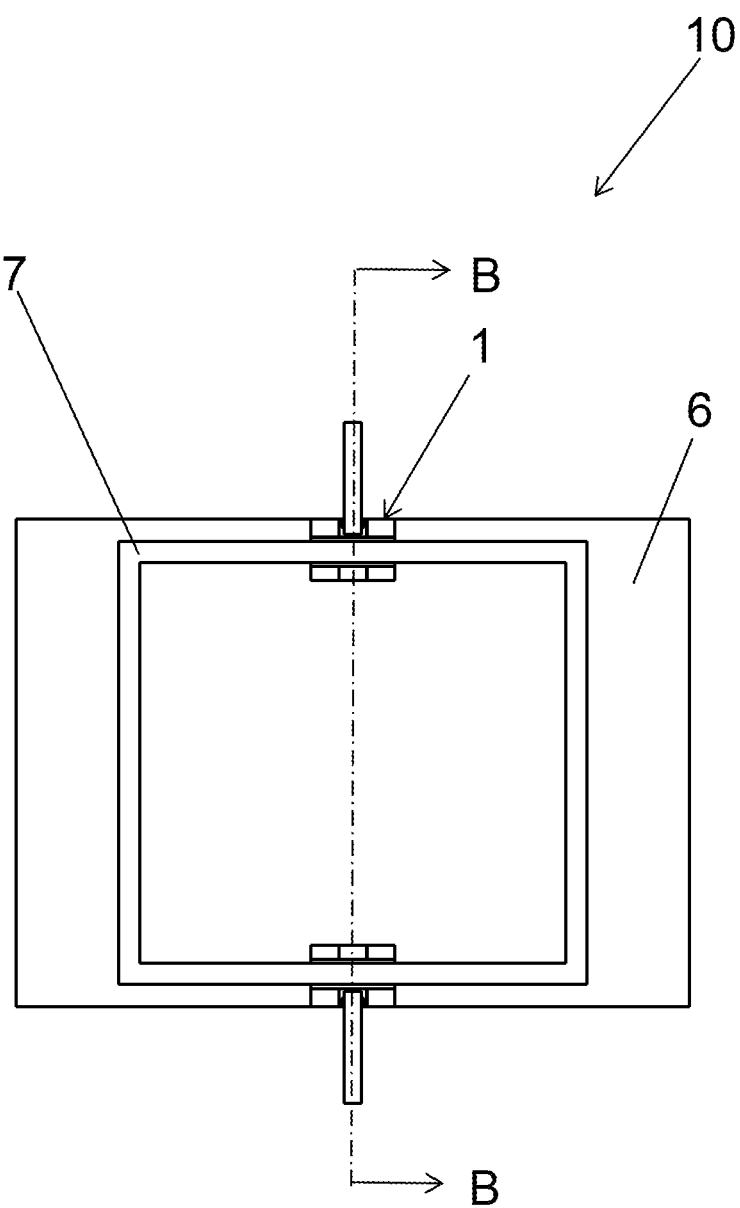
FIG. 4 is a top plan view of the semiconductor package according to the embodiment of the present invention.
Figure 5:
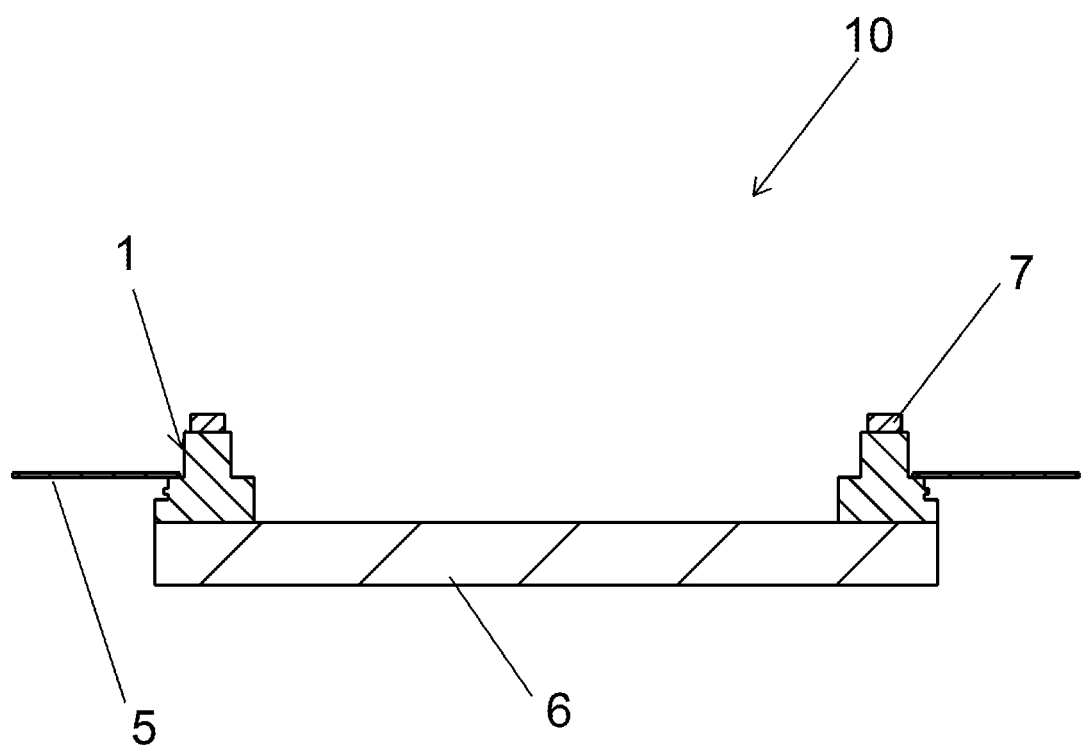
FIG. 5 is a cross-sectional view of the semiconductor package according to the embodiment of the present invention taken along line B-B in FIG. 4.
Figure 6:
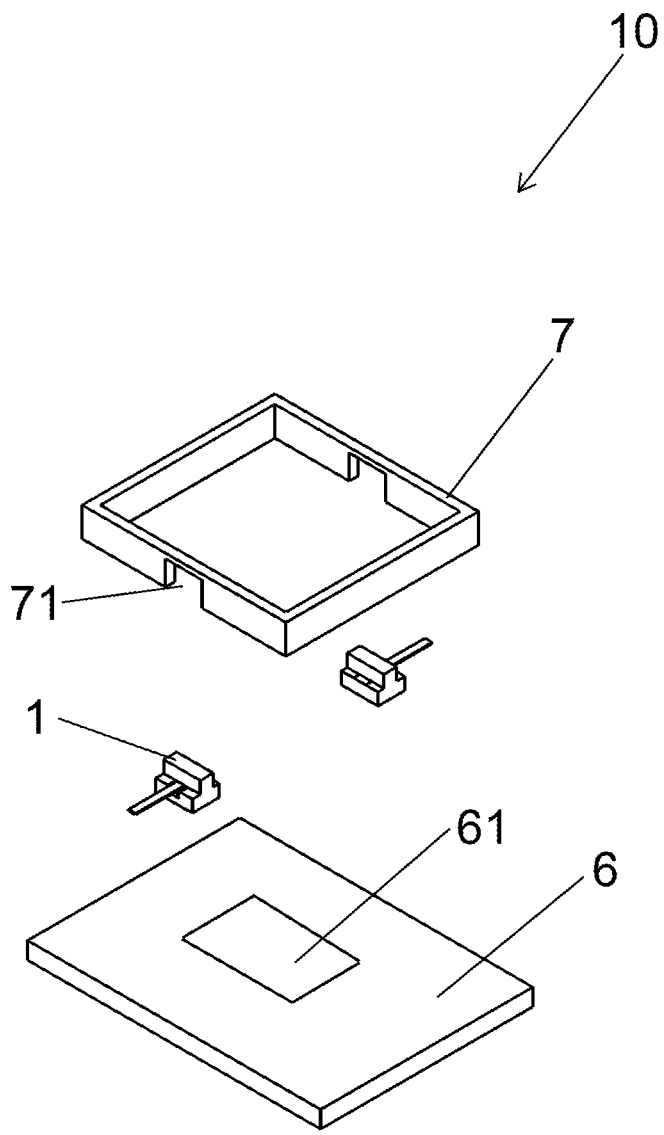
FIG. 6 is an exploded perspective view of the semiconductor package according to the embodiment of the present invention.

FIG. 3 is a top perspective view of the semiconductor package according to the embodiment of the present invention. FIG. 4 is a top plan view of the semiconductor package according to the embodiment of the present invention. FIG. 5 is a cross-sectional view of the semiconductor package according to the embodiment of the present invention taken along line B-B in FIG. 4. FIG. 6 is an exploded perspective view of the semiconductor package according to the embodiment of the present invention. In these figures, the semiconductor package 10 includes the base 6, the frame 7, and the insulating components 1 described above according to the embodiment of the present invention.

As shown in FIGS. 3 to 6, the base 6 is, for example, rectangular in a plan view. The base 6 has the dimensions of 5×5 mm to 50×50 mm and a thickness of 0.3 to 3 mm.

The frame 7 surrounds the upper surface of the base 6. The frame 7 is rectangular in a plan view, and has the dimensions of 5×5 mm to 45×45 mm and a height of 3 to 10 mm. The frame 7 has a thickness of 0.5 to 3 mm. The frame 7 has an outer shape smaller than the base 6 in a plan view. The insulating components 1 (described later) can be firmly fixed to the base 6.

The base 6 and the frame 7 may be formed from, for example, a metal such as iron, copper, nickel, chromium, cobalt, molybdenum, or tungsten, or an alloy of these metals, such as a copper-tungsten alloy, a copper-molybdenum alloy, or an iron-nickel-cobalt alloy. A metal member for the base 6 may be prepared by processing (e.g., rolling or punching) an ingot formed from such a metal material.

The frame 7 has the through-holes 71 in its side walls as shown in FIG. 6. The through-holes 71 receive and fix the insulating components 1 (described later). In the semiconductor package 10, the insulating components 1 are used as input/output terminals.

Structure of Insulating Component

Figure 7:
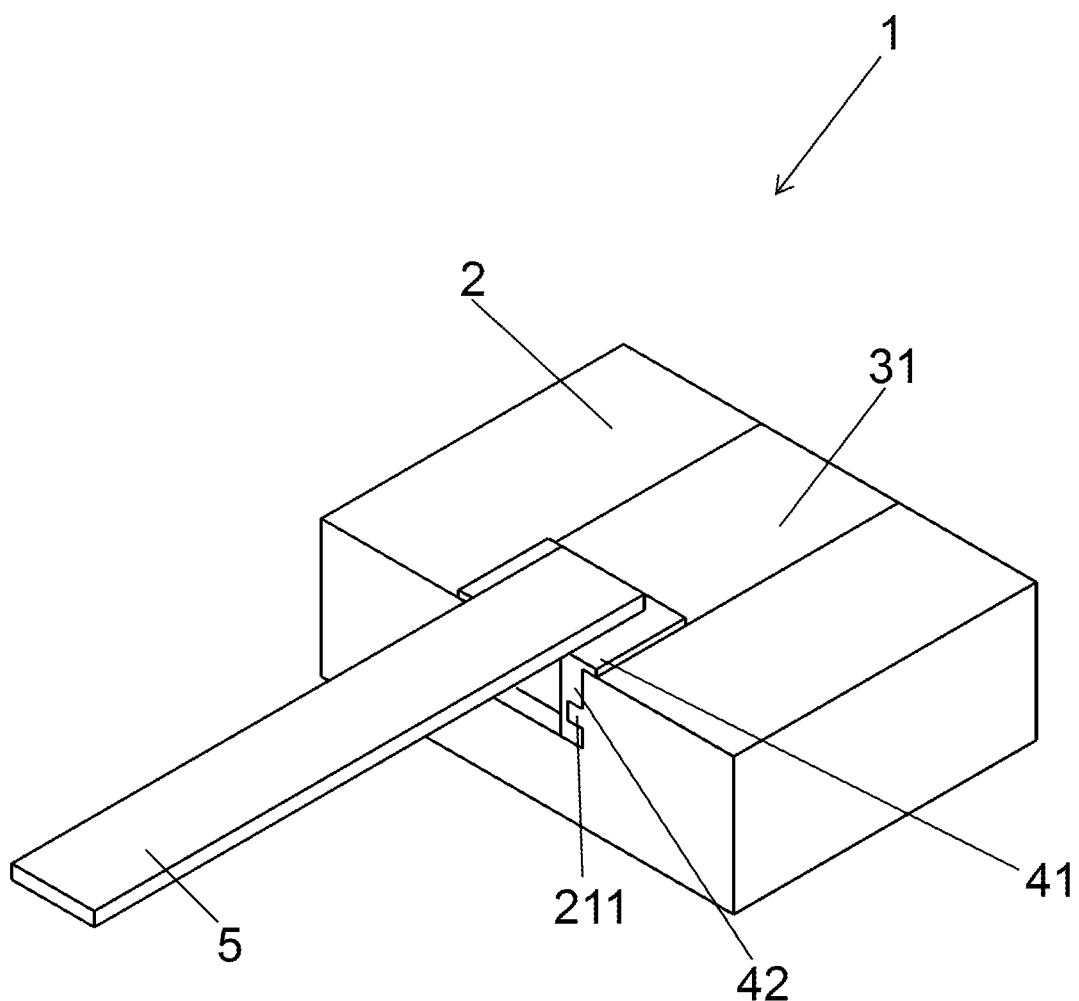
FIG. 7 is a top perspective view of an insulating component according to the embodiment of the present invention.
Figure 8:
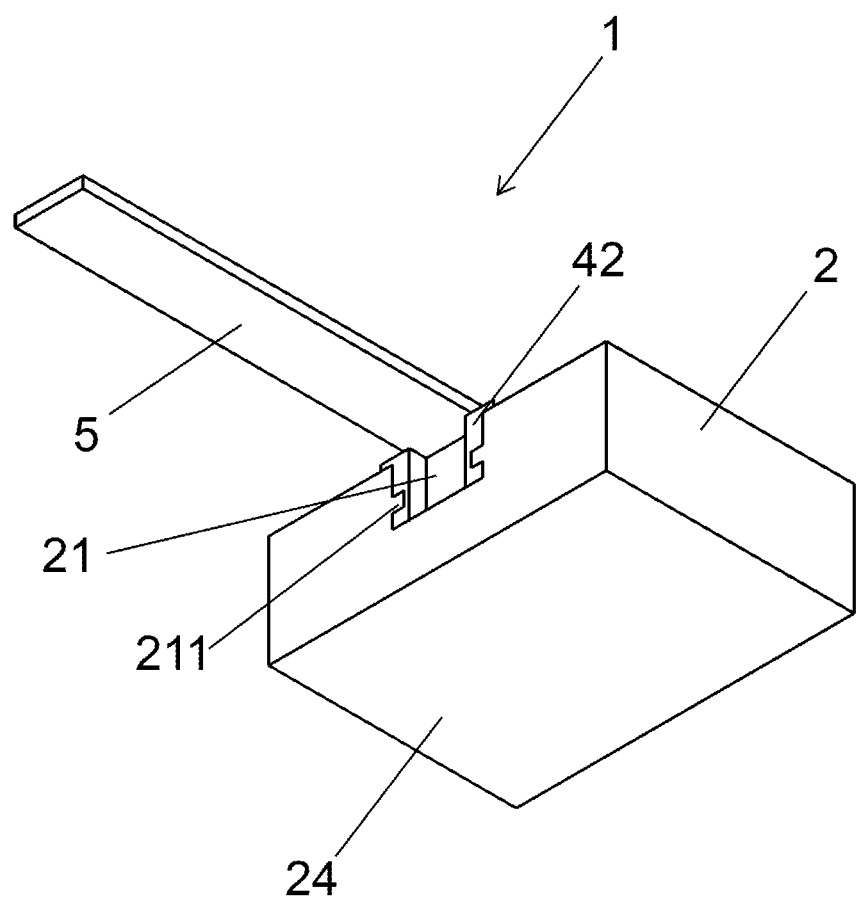
FIG. 8 is a bottom perspective view of the insulating component according to the embodiment of the present invention.
Figure 9:
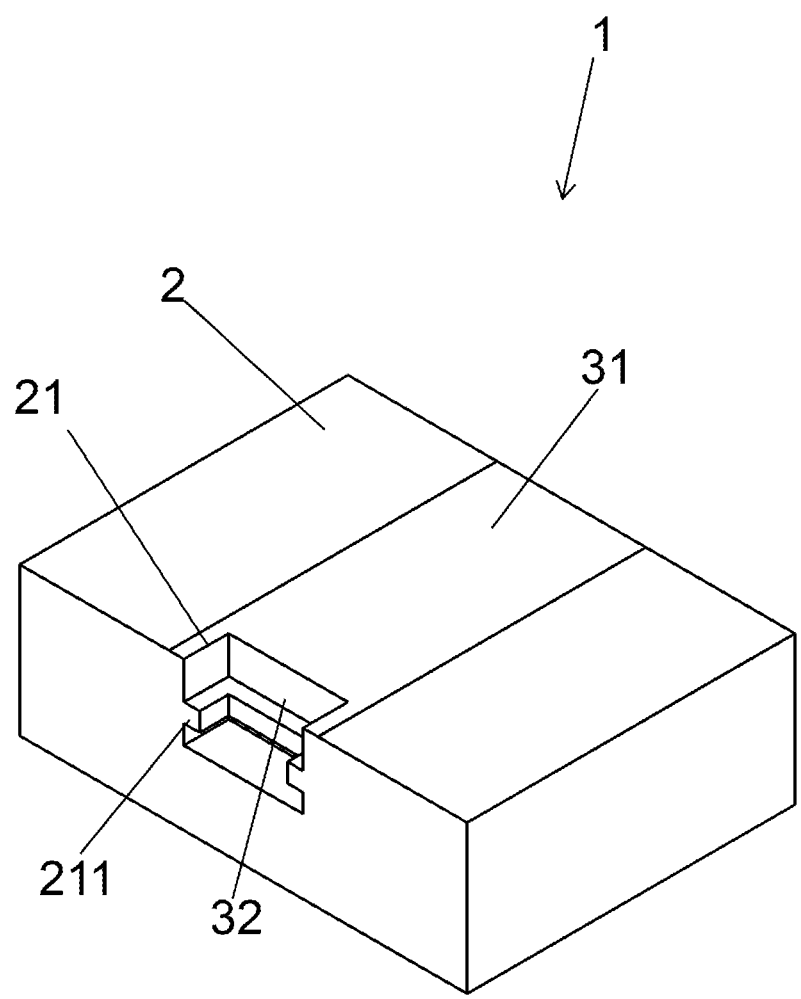
FIG. 9 is a top perspective view of the insulating component without a bond according to the embodiment of the present invention.
Figure 10:
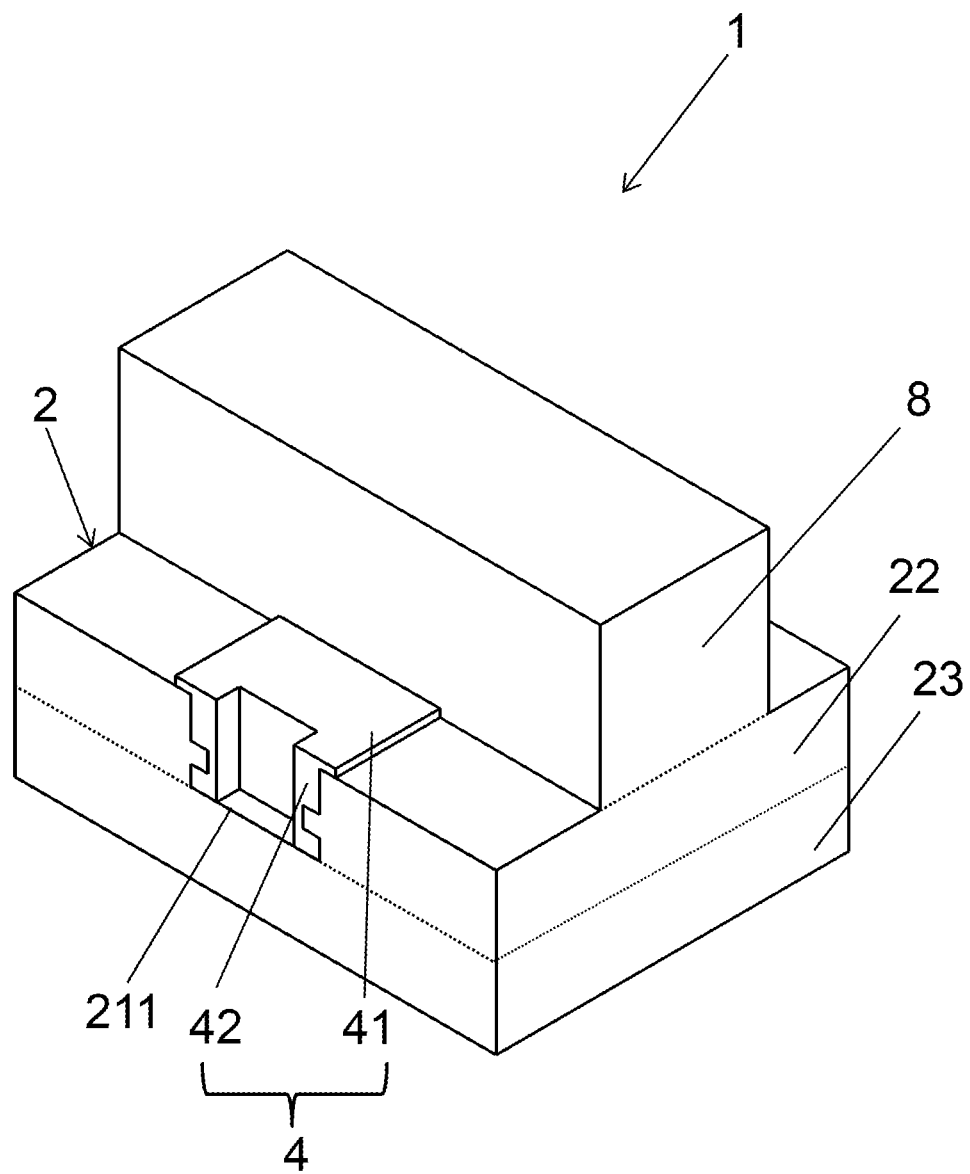
FIG. 10 is a top perspective view of an insulating component according to another embodiment of the present invention.
Figure 11:
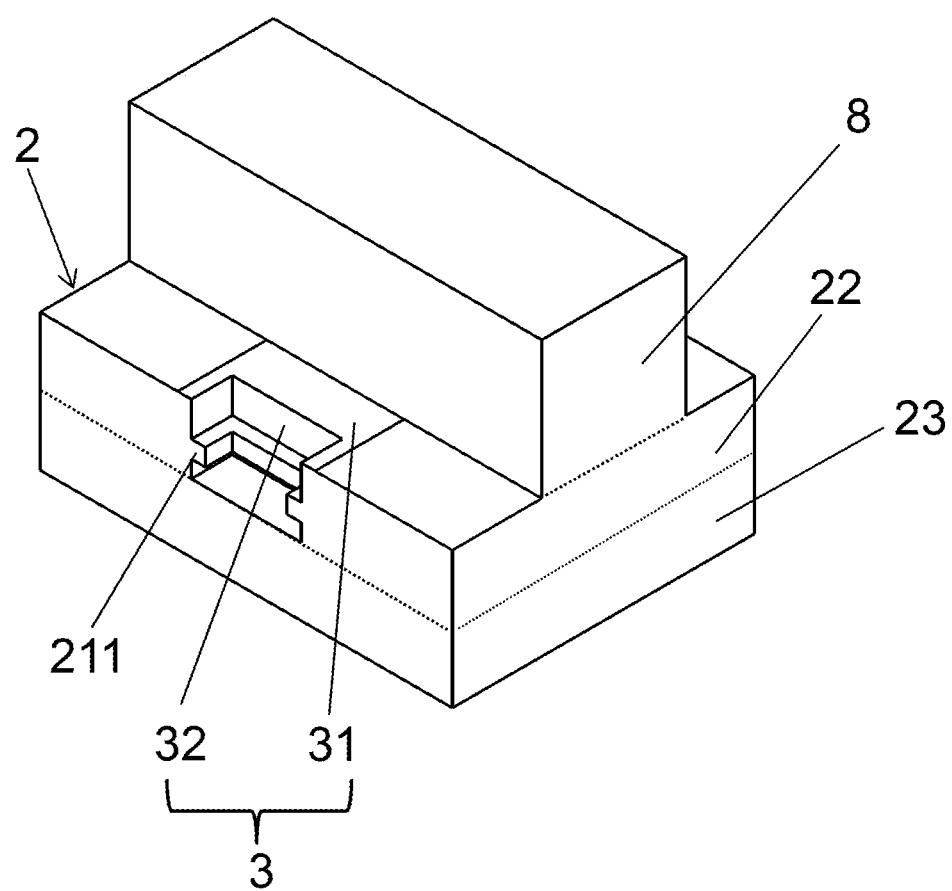
FIG. 11 is a top perspective view of the insulating component without a bond according to the other embodiment of the present invention.

FIG. 7 is a top perspective view of the insulating component according to the embodiment of the present invention. FIG. 8 is a bottom perspective view of the insulating component according to the embodiment of the present invention. FIG. 9 is a top perspective view of the insulating component without a bond according to the embodiment of the present invention. FIG. 10 is a top perspective view of an insulating component according to another embodiment of the present invention. FIG. 11 is a top perspective view of the insulating component without a bond according to the other embodiment of the present invention. For ease of explanation, a lead terminal 5 is not shown in FIGS. 9, 10, and 11. The insulating component 1 in these figures includes an insulating substrate 2, a metal layer 3, a bond 4, and the lead terminal 5. As shown in FIGS. 10 and 11, the insulating component 1 according to the other embodiment may include, in addition to the members described above, a wall 8 standing on an upper surface of the insulating substrate 2.

As shown in FIGS. 10 and 11, the insulating substrate 2 is a laminate of a first insulating layer 22 and a second insulating layer 23 formed from dielectric materials. The insulating substrate 2 is, for example, rectangular in a plan view, and has the dimensions of 2×2 mm to 20×20 mm and a height of 0.5 to 5 mm. Each insulating layer in the insulating substrate 2 is formed from a dielectric material. Examples of the dielectric material include ceramic materials such as sintered aluminum oxide, sintered mullite, sintered silicon carbide, sintered aluminum nitride, and sintered silicon nitride, as well as glass ceramic materials.

The insulating substrate 2 has a groove 21 continuous from its upper surface (surface to which the lead terminal 5 is joined) to its side surface. The groove 21 is, for example, rectangular as viewed laterally, and has the dimensions of 0.3×0.3 mm to 4×4 mm. The groove 21 has a depth of, for example, 0.3 to 4 mm in a plan view.

The groove 21 has a ridge 211 protruding on its inner walls. When viewed from above, the ridge 211 constitutes 5 to 70% of the width of the groove 21. The ridge 211 constituting at least 5% of the width of the groove 21 allows the bond 4 to easily fill an area between the ridge 211 and the lead terminal 5, whereas the ridge 211 constituting less than or equal to 70% of the width of the groove 21 allows the bond 4 to fill an area between the ridge 211 and the second insulating layer 23. The ridge 211 allows the bond 4 to easily fill the area between the ridge 211 and the lead terminal 5 while reducing an excess amount of bond 4 around the lead terminal 5.

In the groove 21, the ridge 211 is located below the midpoint of the side wall of the first insulating layer 22 (the side wall including the groove) in the layer stacking direction (direction from the second insulating layer 23 toward the lead terminal 5). The ridge 211 located below the midpoint allows more bond 4 to easily fill the area of the groove 21 nearer the lead terminal 5 (described later) or specifically the area between the ridge 211 and the lead terminal 5, and less bond 4 to fill the area of the groove 21 farther from the lead terminal 5 or specifically the area between the ridge 211 and the second insulating layer 23. The ridge 211 thus easily allows the bond 4 to be continuous across the area between the ridge 211 and the lead terminal 5 and the other area.

When the side wall of the first insulating layer 22 is viewed laterally, the ridge 211 protrudes from the facing inner walls of the groove 21 (walls perpendicular to the upper surface of the insulating substrate 2), rather than from one of the facing inner walls. In the cross-sectional view of the groove 21 in FIG. 5, the ridge extends continuously along the inner wall of the groove 21 in the direction of the side wall of the first insulating layer 22. In the groove 21, the ridge 211 extends continuously along the inner walls of the groove 21 to have the same height in a direction perpendicular to the inner walls of the groove 21.

When the side wall of the first insulating layer 22 is viewed laterally, the ridge 211 protrudes from each of the facing inner walls of the groove 21 with the same height as described above. This structure places the bond 4 uniformly as well as in a sufficient amount on both sides of the lead terminal 5 (on the inner walls of the groove 21) in the area of the groove 21 between the ridge 211 and the lead terminal 5. This improves the strength of the joint between the lead terminal 5 and the metal layer 3 with the bond 4 placed on both sides of the lead terminal 5. When the lead terminal 5 receives an external force, the bond 4 further regulates stress acting on the joint between the lead terminal 5 and the metal layer 3. The insulating component 1 according to the embodiment of the present invention can thus have less cracks or breaks in the insulating substrate 2.

The insulating substrate 2 may have a ground conductor on its bottom surface (surface opposite to the upper surface of the insulating substrate 2). The ground conductor is, for example, rectangular in a plan view, and has the dimensions of 2×2 mm to 20×20 mm. The ground conductor is formed from, for example, a metal material such as tungsten, molybdenum, manganese, or nickel.

As shown in FIG. 9, the metal layer 3 is located on the upper surface of the insulating substrate 2, or specifically is located continuously from the upper surface of the first insulating layer 22 to the inner walls of the groove 21. The metal layer 3 includes, on the upper surface of the insulating substrate 2, a first metal layer 31 as a line conductor for transmitting electric signals, and a second metal layer 32 located on the inner walls of the groove 21. The first metal layer 31 extends from an upper end of the groove 21 (nearer the lead terminal 5) toward another side wall of the first insulating layer 22 opposite to the side wall including the groove 21. The first metal layer 31 and the second metal layer 32 are continuous with each other. The metal layer 3 is formed from, for example, a metal material such as gold, silver, copper, nickel, tungsten, molybdenum, or manganese, and may be formed on the surface of the first insulating layer 22 as a metallization layer or a plated layer by co-firing or metal plating.

When the ground conductor is located at least on the bottom surface of the insulating substrate 2 or between the first insulating layer 22 and the second insulating layer 23, the first metal layer 31 is located to overlap the ground conductor on each insulating layer. This structure allows the first metal layer 31 and the ground conductor on each layer to form a strip line structure. This facilitates transmission of high-frequency signals.

The groove 21 contains the second metal layer 32 on its inner walls. The second metal layer 32 and the first metal layer 31 are continuous with each other. For example, the second metal layer 32 is located across all the inner walls of the groove 21. The second metal layer 32 is formed from, for example, a metal material such as gold, silver, copper, nickel, tungsten, molybdenum, or manganese, and may be formed on the inner walls of the groove 21 as a metallization layer or a plated layer by co-firing or metal plating in the same manner as the first metal layer 31.

As shown in FIG. 10, the metal layer 3 has the bond 4 on its surface. The bond 4 on the metal layer 3 joins and fixes the lead terminal 5 (described later) to the upper surface of the insulating substrate 2. The bond 4 includes a first bond 41 located on the surface of the first metal layer 31 to join and fix the lead terminal 5 to the first metal layer 31, and a second bond 42 located on the second metal layer 32 at the inner walls of the groove 21. The bond 4 includes the first bond 41 and the second bond 42 that are continuous with each other. The bond 4 may be formed from a silver brazing material. The bond 4 may also be a phosphor copper brazing material or an aluminum-magnesium brazing material.

The first bond 41 is located on the surface of the first metal layer 31. The lead terminal 5 is joined and fixed with the first bond 41.

The second bond 42 is located between the ridge 211 in the groove 21 and the lead terminal 5. The second bond 42 is also located below the ridge 211, in addition to between the ridge 211 and the lead terminal 5. In other words, the second bond 42 is located on a portion of the second metal layer 32 between the ridge 211 and the second insulating layer 23. On each of the inner walls of the groove 21, more second bond 42 fills the area above the ridge 211 (nearer the lead terminal 5) than the area below the ridge 211 (nearer the second insulating layer 23). This makes it less likely to have an excess amount of bond 4 on the second metal layer 32 between the ridge 211 and the second insulating layer 23 from causing an unintended joint. The bond 4 on the second metal layer 32 between the ridge 211 and the lead terminal 5 joins and fixes the lead terminal 5, and improves the strength of the joint between the lead terminal 5 and the metal layer 3.

Any excess amount of second bond 42 on the second metal layer 32 between the ridge 211 and the second insulating layer 23 may cause cracks or breaks in the first insulating layer 22 including the ridge 211 under heat, due to the different thermal expansion coefficients of the second insulating layer 23 and the second bond 42. The ridge 211 allows a small amount of bond 4 to flow to and be fixed on the second metal layer 32 between the ridge 211 and the second insulating layer 23 although more bond 4 is used to join the lead terminal 5 and the second metal layer 32 to improve the strength of the joint. This structure further allows an increased amount of bond 4 to flow to and be fixed on the second metal layer 32 between the ridge 211 and the lead terminal 5.

The insulating component 1 with the structure according to the embodiment of the present invention improves the strength of the joint between the insulating substrate 2 and the lead terminal 5, and reduces cracks or breaks in the insulating substrate 2. This is achieved by allowing more bond 4 to be easily held between the lead terminal 5 and the ridge 211 included in the groove 21 included in the insulating substrate 2, and also by allowing less bond 4 to be in the area below the ridge 211. The bond 4 can thus be held more easily around the lead terminal 5. In other words, this structure improves the strength of the joint between the lead terminal 5 and the insulating substrate 2, and reduces stress caused by an external force applied to the lead terminal 5 and acting on the joint between the lead terminal 5 and the metal layer 3. This reduces cracks and breaks in the insulating substrate 2, thus enabling stable signal transmission.

The first insulating layer 22 alone has the groove 21. In this case, the second insulating layer has no groove on its side surface. This maintains the rigidity of the insulating substrate 2.

As viewed from above, the second metal layer 32 is not located on a portion of the upper surface of the second insulating layer 23 overlapping the groove 21. The upper surface of the second insulating layer 23 is thus exposed as viewed from above. The second insulating layer 23 tends not to receive a load from stress caused by the different thermal expansion coefficients of the second metal layer 32 and the second bond 42. This reduces cracks and breaks in the second insulating layer 23.

The groove 21 is narrower than the first metal layer 31 as viewed from above. This allows the bond 4 to fill a space defined by the surface of the lead terminal 5 facing the first metal layer 31 and the inner walls of the groove 21, and allows the lead terminal 5 to be more firmly fixed to the metal layer 3.

As shown in FIGS. 10 and 11, the insulating component 1 may include the wall 8 standing on the upper surface of the first insulating layer 22. The wall 8 may externally protect the first metal layer 31 for transmitting signals. In this case, the upper surface of the wall 8 is joined to the frame 7 (described later). In particular, the frame 7 formed from a metal material and the insulating component 1 formed from a ceramic material can cause stress due to the different thermal expansion coefficients. A load applied to the insulating component 1 is less likely to affect the first metal layer 31, and the insulation is maintained between the first metal layer 31 and the frame 7.

The wall 8 may be formed from a dielectric material. Examples of the dielectric material include ceramic materials such as sintered aluminum oxide, sintered mullite, sintered silicon carbide, sintered aluminum nitride, and sintered silicon nitride, as well as glass ceramic materials. The wall 8 may be formed integrally with the insulating substrate 2. The integrated structure eliminates the bond or other materials for joining, and can thus simplify the manufacturing processes, or can have a reduced thickness. This structure further eliminates stress caused by the different thermal expansion coefficients of the insulating substrate 2, the bond, and the wall 8, and thus reduces a load from the stress applied to the insulating substrate 2 or the wall 8.

Method for Manufacturing Insulating Component

The insulating substrate 2 including multiple first insulating layers 22 or second insulating layers 23 formed from, for example, sintered aluminum oxide may be prepared in the manner described below. An aluminum oxide-containing powdery raw material is mixed with, for example, an appropriate organic binder and an appropriate solvent to form slurry. The slurry is then shaped into sheets using, for example, a doctor blade, to yield multiple ceramic green sheets. The ceramic green sheets are cut or punched into an appropriate shape. A ceramic green sheet to be the uppermost sheet has a groove to be the groove 21. The ceramic green sheets are then stacked one on another and pressure-bonded.

The metal layer 3 (first and second metal layers 31 and 32) and the ground conductors on the upper surfaces of the layers are formed from, for example, a metallization layer that may be formed from a metal having a high melting point, such as tungsten, molybdenum, or manganese, prepared in the manner described below. A metal powder with a high melting point is kneaded with an organic solvent and a binder fully into a metal paste. The metal paste is then printed at predetermined positions on the ceramic green sheets to be the upper surfaces of the first insulating layer 22 and the second insulating layer 23 by, for example, screen printing. The stacked ceramic green sheets are then fired at a temperature of about 1600° C. in a reducing atmosphere to complete the insulating substrate 2.

Through these processes, the metallization layers are applied to the upper surface and the interior of the insulating substrate 2 or between the insulating layers to serve as the ground conductors on the metal layer and the upper surfaces of the insulating layers.

The present invention is not limited to the above embodiments, but may be modified variously without departing from the spirit and scope of the invention. Modifications contained in the claims can fall within the scope of the present invention.

REFERENCE SIGNS LIST 1 insulating component
2 insulating substrate
21 groove
211 ridge
22 first insulating layer
23 second insulating layer
24 ground conductor layer
3 metal layer
31 first metal layer
32 second metal layer
4 bond
41 first bond
42 second bond
5 lead terminal
6 base
61 mount area
7 frame
71 through-hole
8 wall
10 semiconductor package
11 semiconductor device
12 lid
100 semiconductor apparatus

The invention claimed is:

1. An insulating component, comprising:
    an insulating substrate being plate-like and having a groove located continuously from an upper surface to a side surface of the insulating substrate;
    a metal layer including a first metal layer located on the upper surface of the insulating substrate and a second metal layer located on an inner surface of the groove and continuous with the first metal layer;
    a bond located on an upper surface of the metal layer; and
    a lead terminal located on an upper surface of the first metal layer with the bond in-between, the lead terminal overlapping the groove as viewed from above,
    wherein the bond includes a first bond fixing the lead terminal to the first metal layer and a second bond located on an upper surface of the second metal layer and continuous with the first bond,
    the groove includes an inner wall having a ridge, and
    a first portion of the second bond is located between the ridge and the lead terminal.

2. The insulating component according to claim 1, wherein
    the ridge protrudes from facing inner walls of the groove as viewed laterally.

3. The insulating component according to claim 1, wherein
    the second bond includes the first portion located in an area above the ridge and a second portion located in an area below the ridge,
    the first portion being larger in volume than the second portion.

4. The insulating component according to claim 1, wherein
    the insulating substrate includes a stack of a plurality of insulating layers,
    the plurality of insulating layers include a first insulating layer including the first metal layer on an upper surface of the first insulating layer, and a second insulating layer located on a bottom surface of the first insulating layer, and
    the groove is located continuously from the upper surface to a side surface of the first insulating layer.

5. The insulating component according to claim 4, wherein
    the second insulating layer includes an upper surface exposed in an area overlapping the groove as viewed from above.

6. The insulating component according to claim 4, wherein the groove is not located below an upper surface of the second insulating layer.

7. The insulating component according to claim 1, wherein
    the groove is narrower than the first metal layer as viewed from above.

8. A semiconductor package, comprising:
    a base having an upper surface, the upper surface having a mount area on which a semiconductor device is mountable;
    a frame surrounding the mount area on the base; and the insulating component according to claim 1 fixed to the frame.

9. A semiconductor apparatus, comprising:

the semiconductor package according to claim 8;

the semiconductor device mounted on the mount area in the semiconductor package; and a lid joined the frame included in the semiconductor package and covering the semiconductor device.

10. An insulating component, comprising:

an insulating substrate being plate-like and having a groove located from an upper surface to a side surface of the insulating substrate;

a metal layer including a first metal layer located on the upper surface of the insulating substrate and a second metal layer located on an inner surface of the groove and connected to the first metal layer;

a bond located on an upper surface of the metal layer; and a lead terminal located on an upper surface of the first metal layer with the bond in between, the lead terminal overlapping the groove as viewed from above, wherein the groove includes an inner wall having a ridge, and the bond includes a first part affixing the lead terminal to the first metal layer and a second part located between the ridge and the lead terminal.

11. An insulating component, comprising:

an insulating substrate being plate-like and having a groove located continuously from an upper surface to a side surface of the insulating substrate;

a metal layer including a first metal layer located on the upper surface of the insulating substrate and a second metal layer located on an inner surface of the groove and continuous with the first metal layer; and a bond located on an upper surface of the metal layer;

the bond being configured with a first bond portion for fixing a lead terminal to the first metal layer and a second bond portion located on an upper surface of the second metal layer and continuous with the first bond portion, the groove including an inner wall having a ridge, and a first portion of the second bond portion is located between the ridge and the lead terminal.

\* \* \* \* \*